(12) United States Patent
Shao et al.

(10) Patent No.: US 11,683,953 B2
(45) Date of Patent: Jun. 20, 2023

(54) DISPLAY, METHOD AND JIG FOR MAKING DISPLAY, AND TERMINAL EQUIPMENT

(71) Applicant: BEIJING XIAOMI MOBILE SOFTWARE CO., LTD., Beijing (CN)

(72) Inventors: Haitao Shao, Beijing (CN); Rui Li, Beijing (CN); Yuanjing Wang, Beijing (CN); Zhenhua Shi, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 62 days.

(21) Appl. No.: 17/244,900

(22) Filed: Apr. 29, 2021

(65) Prior Publication Data

US 2022/0085325 A1 Mar. 17, 2022

(30) Foreign Application Priority Data

Sep. 15, 2020 (CN) .......................... 202010968587.0

(51) Int. Cl.
| | |
|---|---|
| *H01L 51/52* | (2006.01) |
| *H10K 50/844* | (2023.01) |
| *H10K 50/84* | (2023.01) |
| *H10K 71/00* | (2023.01) |
| *H10K 50/86* | (2023.01) |

(52) U.S. Cl.
CPC .......... *H10K 50/844* (2023.02); *H10K 50/84* (2023.02); *H10K 71/00* (2023.02); *H10K 50/86* (2023.02)

(58) Field of Classification Search
CPC ................. G06F 1/1656; G06F 1/1637; G06F 1/133311; G06F 1/133528; G06F 1/1137; G06F 1/133352; G02F 1/133311; G02F 1/1637
See application file for complete search history.

(56) References Cited

U.S. PATENT DOCUMENTS

| | | | |
|---|---|---|---|
| 2002/0005919 A1* | 1/2002 | Bobrov | G02B 5/3016 349/25 |
| 2013/0002133 A1* | 1/2013 | Jin | H01L 51/0097 313/511 |
| 2013/0280529 A1* | 10/2013 | Toyama | C09J 133/08 428/339 |
| 2014/0160694 A1 | 6/2014 | Yoon et al. | |
| 2017/0265340 A1 | 9/2017 | Son et al. | |
| 2018/0003860 A1* | 1/2018 | Cho | B32B 7/12 |
| 2018/0356696 A1 | 12/2018 | Lee et al. | |
| 2019/0073001 A1* | 3/2019 | Kim | G06F 3/0412 |
| 2019/0150332 A1 | 5/2019 | Son et al. | |
| 2020/0315074 A1 | 10/2020 | Son et al. | |

FOREIGN PATENT DOCUMENTS

| | | |
|---|---|---|
| CN | 207851467 U | 9/2018 |
| EP | 2743760 A1 | 6/2014 |
| KR | 20180126157 A | 11/2018 |

OTHER PUBLICATIONS

Extended European Search Report in the European Application No. 21171185.8, dated Nov. 8, 2021, (10p).

* cited by examiner

*Primary Examiner* — Caridad Everhart
(74) *Attorney, Agent, or Firm* — Arch & Lake LLP

(57) ABSTRACT

A display, a jig and a method for making the display, and a terminal equipment are provided. The display includes a display body. Further, at least one side wall of the display body is provided with a waterproof coating.

15 Claims, 14 Drawing Sheets

DISPLAY, METHOD AND JIG FOR MAKING DISPLAY, AND TERMINAL EQUIPMENT

CROSS-REFERENCE TO RELATED APPLICATIONS

This application is based on and claims priority to Chinese Application No. 202010968587.0, filed on Sep. 15, 2020, the content of which is hereby incorporated by reference in its entirety for all purposes.

BACKGROUND

With the advancement of science and technology and the improvement of living standards, terminal equipment, such as cell phones, tablets, etc., are becoming increasingly popular. Waterproof performance of terminal equipment is increasingly critical to improving performance of the terminal equipment. A display module is a weak link in terms of waterproof performance of terminal equipment. A display module in related art has poor waterproof performance and is often affected by moisture such as sweat, etc., impacting the display function of the display module, lowering experience of using the terminal equipment.

SUMMARY

The present disclosure may relate to the field of terminal equipment. Embodiments of the present disclosure provide a display, a method and jig for making the display, and a terminal equipment, capable of solving a defect in related art.

According to a first aspect of the embodiments of the present disclosure, there is provided a display. The display includes a display body. A waterproof coating is disposed on at least one side wall of the display body.

According to a second aspect of the embodiments of the present disclosure, there is provided a method for making a display. The method includes making a display body and making the waterproof coating on the at least one side wall of the display body. The display includes the display body, and a waterproof coating is disposed on at least one side wall of the display body.

According to a third aspect of the embodiments of the present disclosure, there is provided a terminal equipment. The terminal equipment includes a middle frame and a display. The display includes a display body, and a waterproof coating is disposed on at least one side wall of the display body. Further, the middle frame includes a frame and a front case connected to the frame, and an inner surface of the display body is fixedly connected to the front case.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Figure 1:
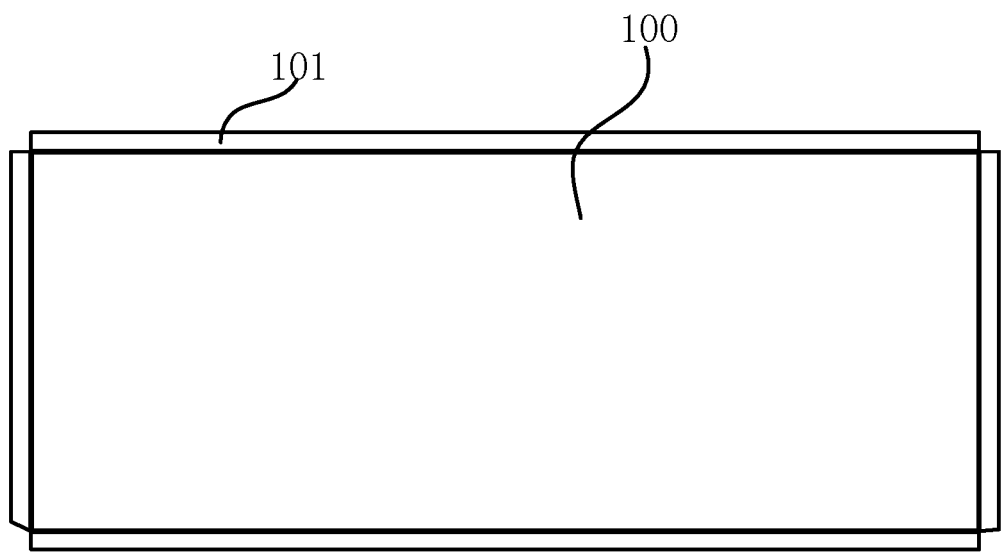
FIG. 1 is a top view of a display module according to an illustrative embodiment of the present disclosure.

Reference will now be made in detail to illustrative embodiments, examples of which are illustrated in the accompanying drawings. The following description refers to the accompanying drawings in which the same numbers in different drawings represent the same or similar elements unless otherwise represented. The implementations set forth in the following description of illustrative embodiments do not represent all implementations consistent with the invention. Instead, they are merely examples of devices and methods consistent with aspects related to the invention as recited in the appended claims. The illustrative implementation modes may take on multiple forms, and should not be taken as being limited to examples illustrated herein. Instead, by providing such implementation modes, embodiments herein may become more comprehensive and complete, and comprehensive concept of the illustrative implementation modes may be delivered to those skilled in the art. Implementations set forth in the following illustrative embodiments do not represent all implementations in accordance with the subject disclosure. Rather, they are merely examples of the apparatus and method in accordance with certain aspects herein as recited in the accompanying claims.

Note that although a term such as first, second, third may be adopted in an embodiment herein to describe various kinds of information, such information should not be limited to such a term. Such a term is merely for distinguishing information of the same type. For example, without departing from the scope of the embodiments herein, the first information may also be referred to as the second information. Similarly, the second information may also be referred to as the first information. Depending on the context, a "if"

as used herein may be interpreted as "when" or "while" or "in response to determining that".

In addition, described characteristics, structures or features may be combined in one or more implementation modes in any proper manner. In the following descriptions, many details are provided to allow a full understanding of embodiments herein. However, those skilled in the art will know that the technical solutions of embodiments herein may be carried out without one or more of the details; alternatively, another method, component, device, option, etc., may be adopted. Under other conditions, no detail of a known structure, method, device, implementation, material or operation may be shown or described to avoid obscuring aspects of embodiments herein.

A block diagram shown in the accompanying drawings may be a functional entity which may not necessarily correspond to a physically or logically independent entity. Such a functional entity may be implemented in form of software, in one or more hardware modules or integrated circuits, or in different networks and/or processor devices and/or microcontroller devices.

A terminal may sometimes be referred to as a smart terminal. The terminal may be a mobile terminal. The terminal may also be referred to as User Equipment (UE), a Mobile Station (MS), etc. A terminal may be equipment or a chip provided therein that provides a user with a voice and/or data connection, such as handheld equipment, onboard equipment, etc., with a wireless connection function. Examples of a terminal may include a mobile phone, a tablet computer, a notebook computer, a palm computer, a Mobile Internet Device (MID), wearable equipment, Virtual Reality (VR) equipment, Augmented Reality (AR) equipment, a wireless terminal in industrial control, a wireless terminal in unmanned drive, a wireless terminal in remote surgery, a wireless terminal in a smart grid, a wireless terminal in transportation safety, a wireless terminal in smart city, a wireless terminal in smart home, etc.

A term used in an embodiment herein is merely for describing the embodiment instead of limiting the present disclosure. A singular form "a" and "the" used in an embodiment herein and the appended claims may also be intended to include a plural form, unless clearly indicated otherwise by context. Further note that a term "and/or" used herein may refer to and contain any combination or all possible combinations of one or more associated listed items.

Note that although a term such as first, second, third may be adopted in an embodiment herein to describe various kinds of information, such information should not be limited to such a term. Such a term is merely for distinguishing information of the same type. For example, without departing from the scope of embodiments of the present disclosure, the first information may also be referred to as the second information. Similarly, the second information may also be referred to as the first information. Depending on the context, a term "if" as used herein may be interpreted as "when" or "while" or "in response to determining that".

With the advancement of science and technology and the improvement of living standards, terminal equipment, such as cell phones, tablets, etc., are becoming increasingly popular. Waterproof performance of terminal equipment is increasingly critical to improving performance of the terminal equipment. A display may include a display module, a display circuitry, etc. The display module is a weak link in terms of waterproof performance of terminal equipment. A display module in related art has poor waterproof performance and is often affected by moisture such as sweat, etc., impacting the display function of the display module, lowering experience of using the terminal equipment.

Based on this, in a first aspect, at least one embodiment of the present disclosure provides a display module. FIG. 1 shows a top view of the display module. A display may include a display body. As shown in FIG. 1, the display module includes a display module body 100. At least one side wall of the display module body 100 is provided with a waterproof coating 101. As shown in the figure, four side walls of the display module are all provided with a waterproof coating 101, which is illustrative only, and poses no limit to the location of the waterproof coating 101. It works as well if the waterproof coating 101 is provided on any one, any two, or any three of the four side walls.

The display module body 100 may be a display, which may be applied to smart equipment such as a smartphone, a tablet computer, a desktop/laptop/handheld computer, a notebook computer, an ultra-mobile personal computer (UMPC), a netbook, a cell phone, a personal digital assistant (PDA), augmented reality (AR)/virtual reality (VR) equipment, etc.

There are many types of display module bodies 100, such as a liquid crystal display (LCD), an organic light-emitting diode (OLED) display, etc. In this embodiment, an OLED display is used as an example to describe the display module body 100, which however poses no limit to the type of the display module body 100.

After the display module body 100 has been mounted on the terminal equipment, depending on the mounting location, the waterproof requirement differs for each side wall. Some side wall is affected greatly by moisture, and has a high waterproof requirement. Some side wall is slightly or even barely affected by moisture. Therefore, it is possible to determine, according to the waterproof requirement for each side wall, a side wall for which the waterproof coating is to be made.

With embodiments of the present disclosure, by making a waterproof coating on at least one side wall of the display module body 100, waterproof performance of the side wall of the display module body 100 can be improved, preventing moisture such as sweat, etc., from entering the display module body 100 through the side wall, thereby preventing moisture from affecting the display function of the display module, improving experience of using the terminal equipment.

Figure 2:
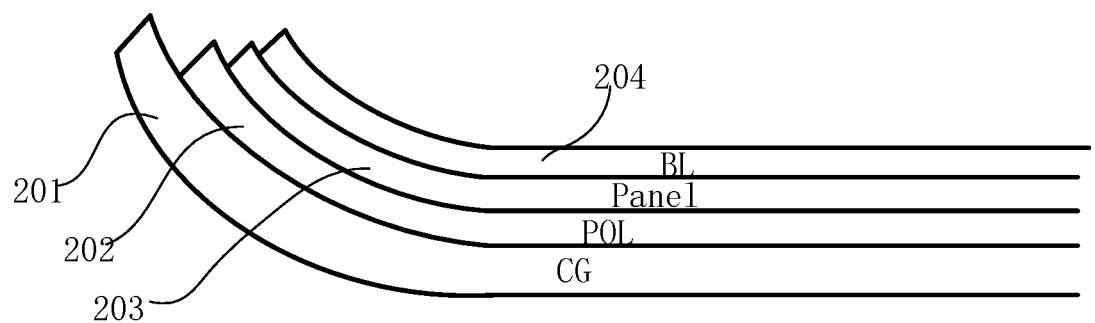
FIG. 2 is a schematic diagram of a structure of a display module body according to an illustrative embodiment of the present disclosure.

FIG. 2 shows a schematic diagram of a structure of a display module body according to some embodiments of the present disclosure. The display module body may include a bottom plate or a bottom layer (BL) 204, a panel 203, a polarizing layer (POL) 202, and a cover glass (CG) 201 fit and connected in sequence.

At least one edge of the CG 201 may be an arc-shaped edge bent toward an inner surface. The POL 202 may be fit and connected to the inner surface of the CG 201. The panel 203 may be fit and connected to a surface of the POL 202 facing away from the CG 201. The BL 204 may be fit and connected to a surface of the panel 203 facing away from the POL 202. Since the CG 201 may be of rigid glass, after the POL 202, the panel 203, and the BL 204 have been connected to the CG 201, the edges of the POL, the panel, and the BL may also form arc-shaped edges. In addition, the surface of each layer may decrease along the direction from the CG 201 to the BL 204, such that a step structure is formed between adjacent layers.

The waterproof coating may cover at least a side wall of the POL 202. In one example, the waterproof coating covers at least two side walls in a widthwise direction and one side wall in a lengthwise direction of the POL 202, because the other side wall of the polarizing layer in the lengthwise direction may have to be used for connection with a low pin count (LPC) bus, thereby implementing connection with a display driver and a terminal motherboard.

A connecting medium may be used to perform connection among the BL 204, the panel 203, the POL 202, and the CG 201. The connecting medium may be a photoresist, a photosensitive glue, a glass melt glue, etc.

Figure 3:
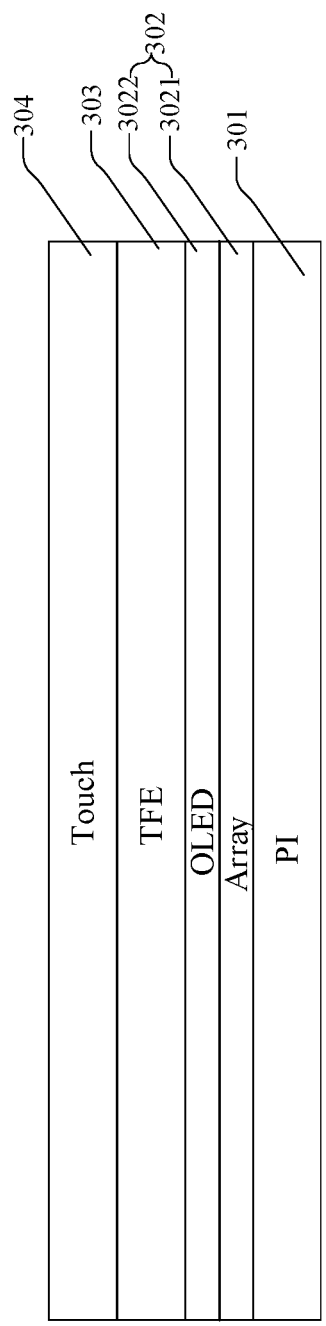
FIG. 3 is a schematic diagram of a structure of a panel according to an illustrative embodiment of the present disclosure.

In addition, FIG. 3 shows a further structure of the panel. The panel may include a polyimide (PI) layer 301, an organic light-emitting device layer 302, a thin film encapsulation layer 303 (a TFE layer), and a touch layer 304 fit and connected in sequence. The organic light-emitting device layer 302 may further include an array sub-layer 3021 and an OLED sub-layer 3022. The PI layer 301 may be fit and connected to the bottom layer. The touch layer 304 may be fit and connected to the polarizing layer.

Figure 4:
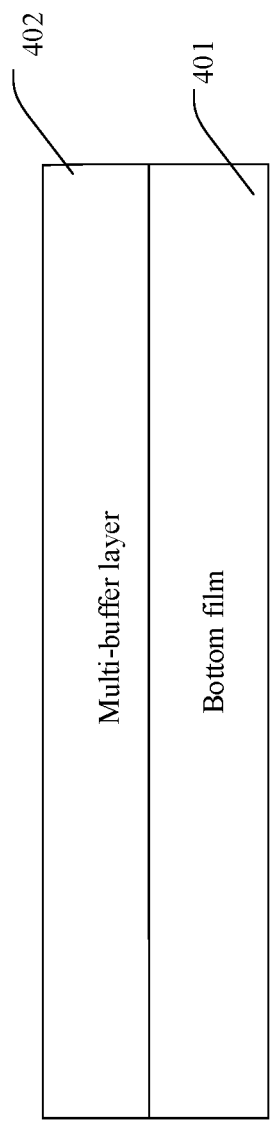
FIG. 4 is a schematic diagram of a structure of a bottom layer according to an illustrative embodiment of the present disclosure.

In addition, FIG. 4 shows a further structure of the bottom layer. The bottom layer may include a multi-buffer layer 402 and a bottom film 401 fit and connected. The multi-buffer layer 402 may be fit and connected to the panel. The multi-buffer layer 402 may be made of polyethylene terephthalate (PET).

In some embodiments of the present disclosure, the thickness of the waterproof coating is less than 0.05 mm. The waterproof coating of the thickness can ensure waterproof tightness without occupying too much space to affect installation of the module and utilization of internal space of the entire terminal equipment.

In some embodiments of the present disclosure, the waterproof coating includes a cross-linked polymer glue (modified Silane, MS, glue) based on Silane-terminated polyether. That is, the waterproof coating is formed by a MS glue based on Silane-terminated polyether. A MS glue based on Silane-terminated polyether has a simple curing condition, with a significant waterproof effect upon curing.

Figure 5:
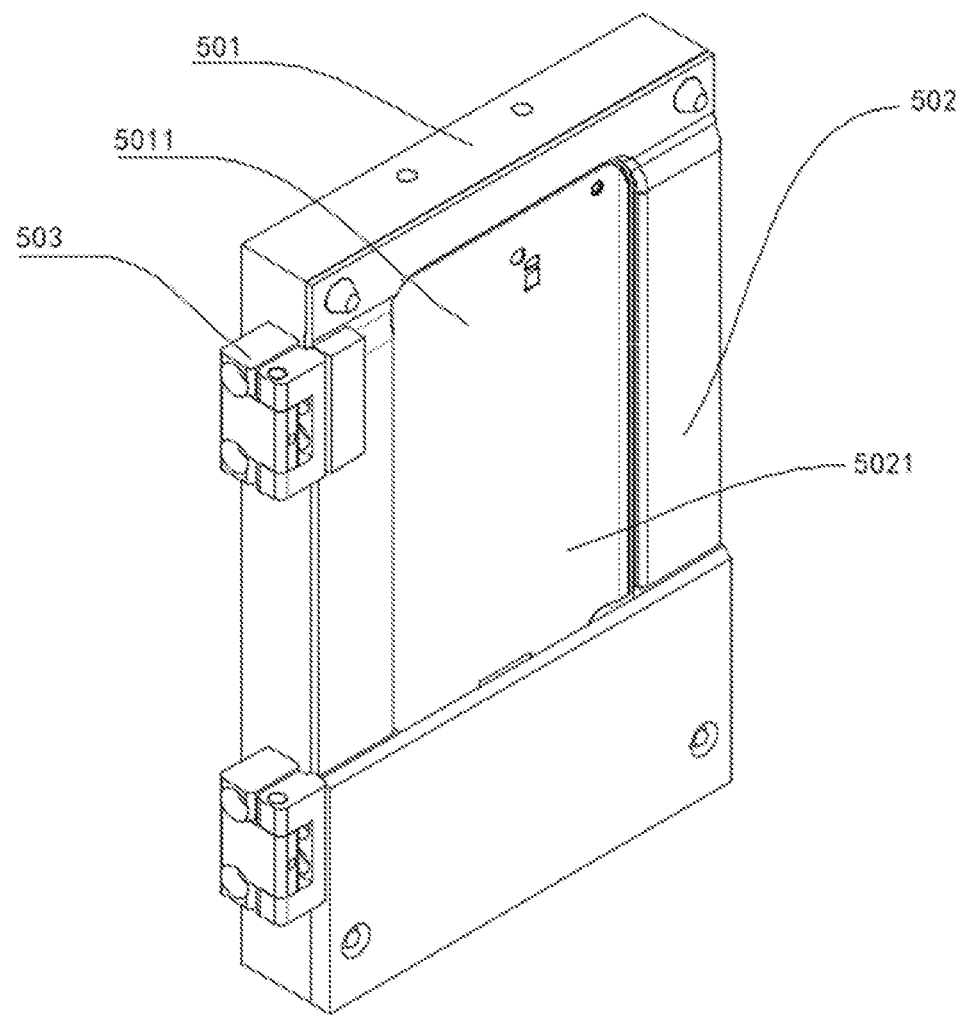
FIG. 5 is a schematic diagram of a structure of a jig according to an illustrative embodiment of the present disclosure.

In a second aspect, at least one embodiment of the present disclosure provides a jig for making the display module of the first aspect. FIG. 5 illustrates a structure of the jig. The jig includes a jig cover 502 and a jig body 501 rotatably connected to each other. The jig body 501 may be provided with a jig groove 5011 for placing the display module body. The jig cover 502 may be provided with a jig hole 5021 matching the jig groove 5011.

The jig body 501 may be connected to the jig cover 502 through at least one rotatable connector 503 (such as a hinge). The jig hole 5021 may be identical to the jig groove 5011 in terms of size. That is, the projection of the jig hole 5021 on the jig body 501 may coincide with the bottom of the jig groove 5011. Accordingly, the display module body in the jig groove 5011 can be completely exposed after the jig cover 502 has been closed. The jig hole 5021 may also be smaller than the size of the jig groove 5011. That is, the projection of the jig hole 5021 on the jig body 501 may fall within the jig groove 5011, but cannot completely fill the bottom of the jig groove 5011. Accordingly, apart of the edge of the display module body in the jig groove 5011 may be masked after the jig cover 502 has been closed, and the remaining part of the edge is in an exposed state. Each edge of the jig hole 5021 may be completely symmetrical or may be asymmetrical, which may be specifically designed as required in making the display module.

Figure 6:
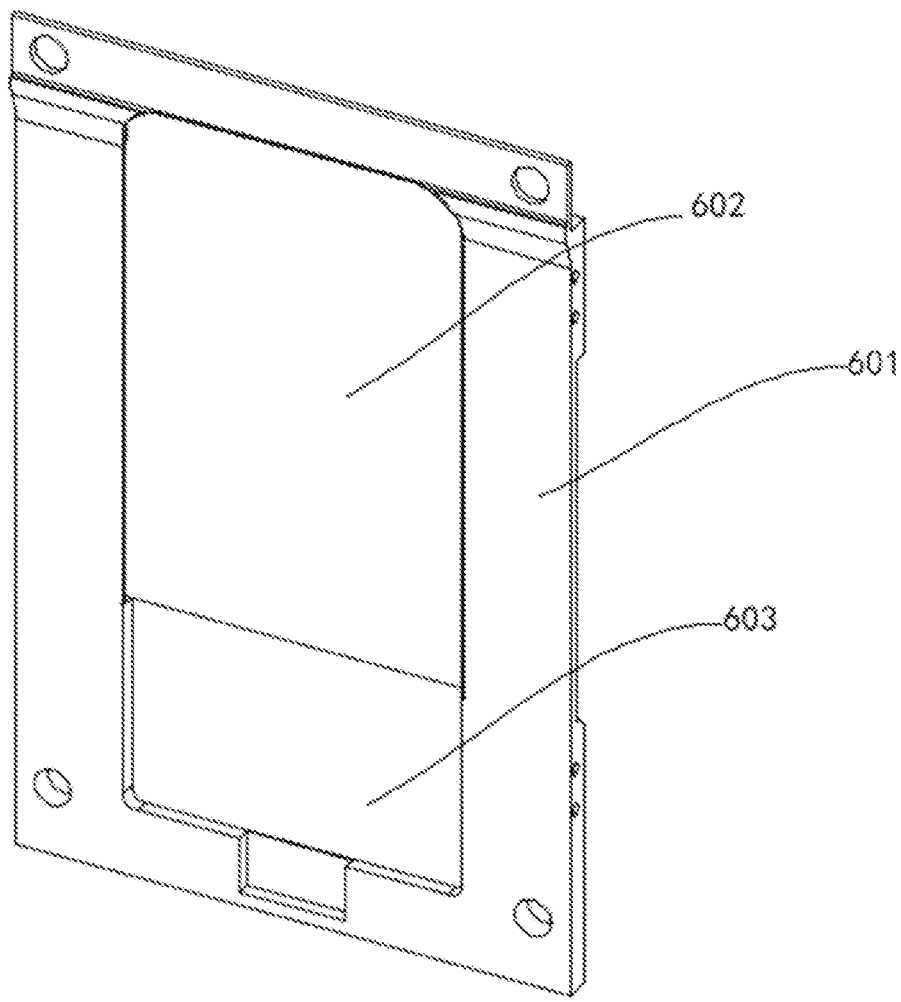
FIG. 6 is a schematic diagram of a structure of a jig cover according to an illustrative embodiment of the present disclosure.

Referring to FIG. 6, in one example, a mask 603 may be provided in the jig hole 602 of the jig cover 601. The mask 603 may be provided on one side along the lengthwise direction of the jig hole 602. By providing the mask 603, the requirement in making the display module can be met, so that a waterproof coating can be selectively made on a certain side wall. The location of the mask 603 shown in FIG. 6 is suitable for making the waterproof coating on two side walls along the widthwise direction and one side wall along the lengthwise direction of the display module body. Of course, the mask 603 may also be provided at another location as required in making the display module. The present disclosure is not intended to limit the location and number of the mask 603.

Figure 7:
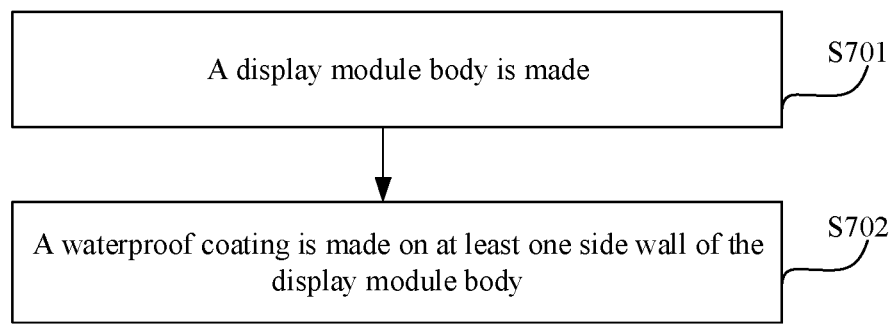
FIG. 7 is a flowchart of a method for making a display module according to an illustrative embodiment of the present disclosure.

In a third aspect, at least one embodiment of the present disclosure provides a method for making a display module of the first aspect. FIG. 7 illustrates a flowchart of the method. The method includes steps S701 to S702.

In S701, a display module body is made.

In this step, layers of the display module body may be connected. For example, the bottom layer, the panel, the polarizing layer, and the cover glass may be fit and connected in a predetermined sequence. A connecting medium may be used to perform connection among the bottom layer, the panel, the polarizing layer, and the cover glass. The connecting medium may be a photoresist, a photosensitive glue, a glass melt glue, etc.

Figure 8:
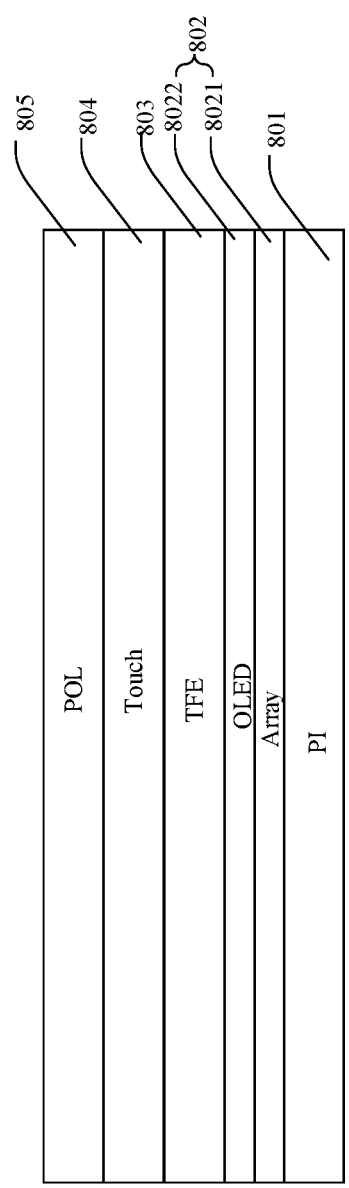
FIG. 8 is a schematic diagram of a structure at a step in a process of making a display module body according to an illustrative embodiment of the present disclosure.
Figure 9:
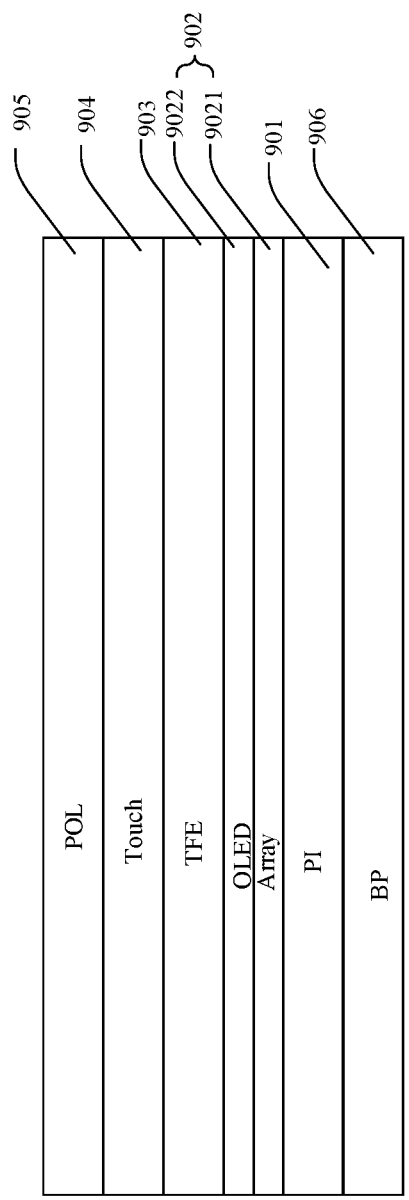
FIG. 9 is a schematic diagram of a structure at a step in a process of making a display module body according to an illustrative embodiment of the present disclosure.
Figure 10:
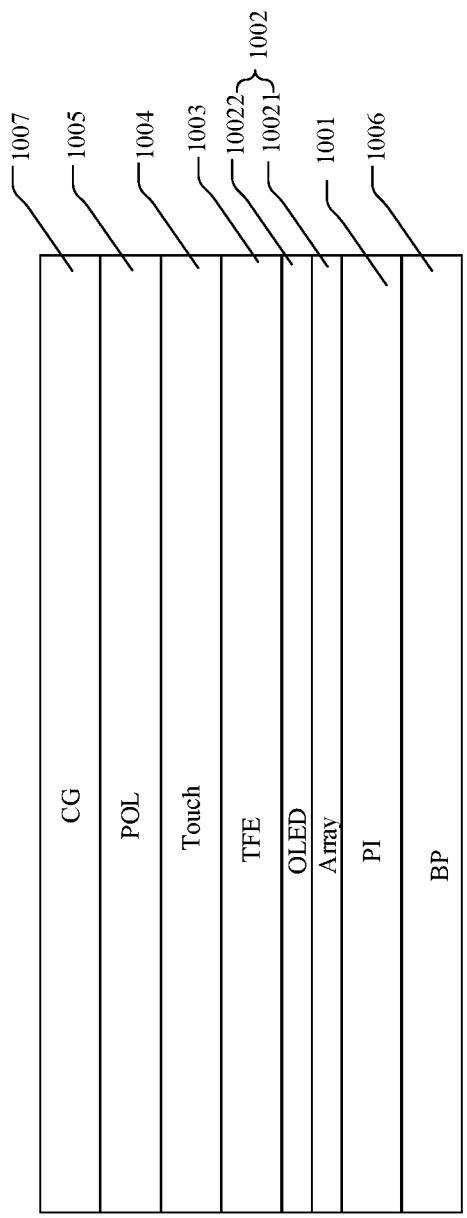
FIG. 10 is a schematic diagram of a structure at a step in a process of making a display module body according to an illustrative embodiment of the present disclosure.

In one example, referring to FIG. 8, first, the panel may be fit and connected to the polarizing layer 805 so that the touch layer 804 of the panel is connected to the polarizing layer 805. In addition, identical to the structure shown in FIG. 3, the panel shown in FIG. 8 may include a polyimide layer 801, an organic light-emitting device layer 802, a TFE layer 803, and a touch layer 804; and the organic light-emitting device layer 802 may further include an array sub-layer 8021 and an OLED sub-layer 8022. Referring to FIG. 9, next, the panel may be fit and connected to the bottom layer 906 so that the polyimide layer 901 of the panel is connected to the bottom layer 906. In addition, identical to the structure shown in FIG. 8, the panel shown in FIG. 9 may include a polyimide layer 901, an organic light-emitting device layer 902, a TFE layer 903, a touch layer 904, and a polarizing layer 905; and the organic light-emitting device layer 902 may further include an array sub-layer 9021 and an OLED sub-layer 9022. Referring to FIG. 10, finally, a side of the polarizing layer 1005 facing away from the panel is connected to the cover glass 1007. In addition, identical to the structure shown in FIG. 9, the panel shown in FIG. 10 may include a polyimide layer 1001, an organic light-emitting device layer 1002, a TFE layer 1003, a touch layer 1004, a polarizing layer 1005, and a bottom layer 1006; and the organic light-emitting device layer 1002 may further include an array sub-layer 10021 and an OLED sub-layer 10022.

In S702, a waterproof coating is made on at least one side wall of the display module body.

A waterproof requirement may differ for each layer of the display module. Some layer may be affected greatly by moisture, while some layer may be slightly or even barely affected by moisture. Of the bottom layer, the panel, the polarizing layer, and the cover glass, the polarizing layer may be affected greatly by moisture, and moisture such as sweat may easily enter the polarizing layer through the side wall of the polarizing layer, thereby affecting the display performance of the entire display module.

After the display module body has been mounted on the terminal equipment, depending on the mounting location, the waterproof requirement differs for each side wall. Some side wall is affected greatly by moisture, and has a high waterproof requirement. Some side wall is slightly or even barely affected by moisture. Therefore, it is possible to determine, according to the waterproof requirement for each side wall, a side wall for which the waterproof coating is to be made.

In one example, the waterproof coating covers at least one side wall of the polarizing layer. That is, of the layers of the display module, a waterproof coating may be made for at least one side wall of the polarizing layer.

In embodiments of the present disclosure, by making a display module body and making a waterproof coating on at least one side wall of the display module body, waterproof performance of the side wall of the display module can be improved, preventing moisture such as sweat, etc., from entering the display module through the side wall, thereby preventing moisture from affecting the display function of the display module, improving experience of using the terminal equipment.

Figure 11:
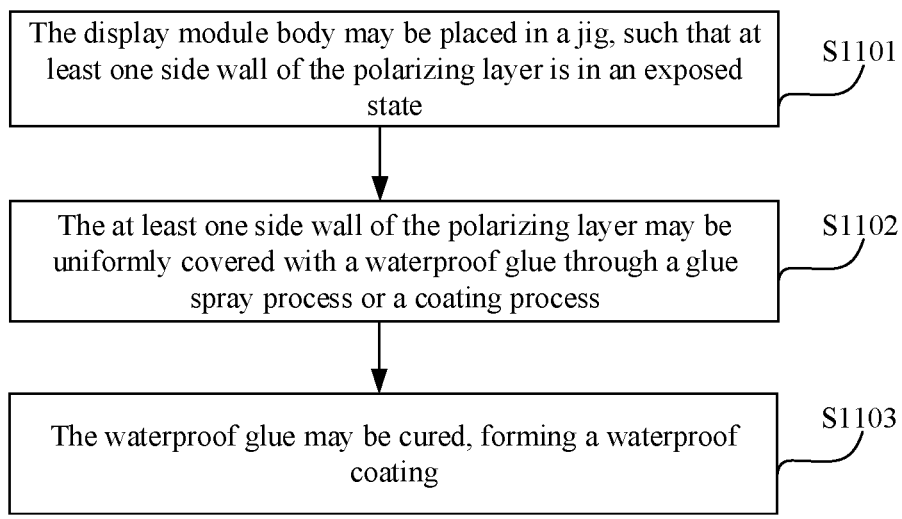
FIG. 11 is a flowchart of making a waterproof coating for at least one side wall of a display module body according to an illustrative embodiment of the present disclosure.

In some embodiments of the present disclosure, a waterproof coating may be made for at least one side wall of the display module body in a mode as shown in FIG. 11, which may specifically include steps S1101 to S1103.

In S1101, the display module body may be placed in a jig of the second aspect, such that at least one side wall of the polarizing layer is in an exposed state.

In one example, first, the display module body may be placed in the jig groove, such that an outer surface of the display module body is connected to a bottom of the jig groove. Then, the jig groove may be closed using the jig cover, such that each side wall of the display module body is masked completely or partially, and the at least one side wall of the polarizing layer is in the exposed state. When placing the display module body, the outer surface of the CG is connected to the bottom of the jig groove. That is, the edge of each of the bottom layer, the CG, the polarizing layer, and the panel may form an arc-shaped edge bent toward an inner surface. That is, the side walls are all oriented toward the opening of the jig groove. The jig cover may mask all or some of the side walls of the display module body. That is, side walls of the CG, the polarizing layer, the panel, and the bottom layer are all masked. Alternatively, they are partly masked, that is, the side wall of the CG is masked, and the side walls of the polarizing layer, the panel, and the bottom layer are all exposed.

Figure 12:
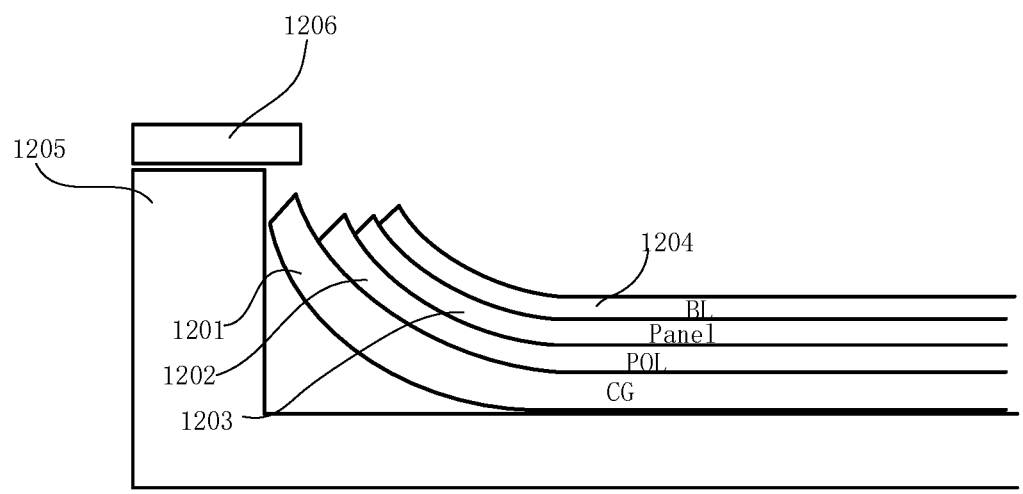
FIG. 12 is a schematic diagram of a relation between locations of a display module body, a jig body, and a jig cover according to an illustrative embodiment of the present disclosure.

For example, the waterproof coating may be made on two side walls in a widthwise direction and one side wall in a lengthwise direction of the polarizing layer. Accordingly, the jig cover is provided with a structure as shown in FIG. 5 and FIG. 6. When the display module body is placed in the jig groove and the jig groove is closed by the jig cover, one side wall in the lengthwise direction of the display module body is completely masked. That is, one side wall in the lengthwise direction of the polarizing layer is masked, preventing the waterproof coating from being made thereon. The area of the jig hole is smaller than the area of the jig groove, so that the jig cover can partially mask the side wall of the display module body. Specifically, FIG. 12 shows a relation among locations of the display module body, the jig body, and the jig cover. As can be seen from FIG. 12, the edges of the cover glass 1201, the polarizing layer 1202, the panel 1203, and the bottom layer 1204 of the display module body disposed in the jig groove of the jig body 1205 each form an arc-shaped edge bent toward an inner surface. The jig cover 1206 closes the jig groove of the jig body 1205. The edge of the jig hole of the jig cover 1206 extends into the range of the jig groove, partially masking the side wall of the display module body, specifically masking the side wall of the cover glass 1201 and the inner surface (i.e., the inner surface of the cover glass 1201 at the step formed by the cover glass 1201 and the polarizing layer 1202), and the side wall of the polarizing layer 1202 is in the exposed state. This not only facilitates making the waterproof coating for the side wall of the polarizing layer 1202, but also avoids making the waterproof coating on the side wall and the inner surface of the cover glass 1201, since the side wall and the inner surface of the cover glass 1201 are both provided with ink, and when the display module is mounted to the terminal equipment, a connecting medium (such as a Polyurethane Reactive, PUR, glue) is to be applied to the ink area of the cover glass for connection with the middle frame of the terminal equipment. Therefore, the subsequent mounting process is prevented from being affected by the ink being covered by the waterproof coating.

A protective film may be provided on the inner surface of the display module body. Specifically, a release paper may be used for the protective film. By providing the protective film, it is possible to avoid making the waterproof coating on the inner surface of the display module body (specifically, the inner surface of the bottom layer 1204), avoiding affecting the subsequent process of processing the display module and the inherent function thereof.

In S1102, the at least one side wall of the polarizing layer may be uniformly covered with a waterproof glue through a glue spray process or a coating process.

A side wall may be covered with the waterproof glue using vacuum coating.

When the glue spray process is used, an operation parameter of glue spray equipment may be adjusted first, so that the glue spray equipment can spray a glue layer of a preset thickness. The glue may be sprayed on a test plane, the thickness of the glue layer may be detected to feed back a parameter error, and continuous adjustment may be made until the preset requirement is met. In one example, an atomization pressure of the glue spray equipment may be set to 0.55 MPa, a glue feeding pressure may be set to 0.3 MPa, an injection speed may be set to 60 mm/s, and the inner diameter of the glue spray nozzle of the glue spray equipment may be set to 0.34 mm.

In one example, an MS glue based on Silane-terminated polyether, specifically, a Momentive 3995 modified Silane glue, may be selected as the waterproof glue.

In S1103, the waterproof glue may be cured, forming the waterproof coating.

The waterproof glue may be cured by heating, standing, etc. In one example, the waterproof glue may be cured by standing for 24 hours.

In embodiments of the present disclosure, the display module body is fixed through the jig. Where the waterproof coating does not need to be made in the display module body is masked using a protective film, and only where the waterproof coating needs to be made in the display module body is exposed, improving accuracy in making the waterproof coating, while preventing the waterproof coating from affecting the subsequent process and inherent function of the display module.

Since a waterproof coating is made on the side wall of the polarizing layer, the display module made using the method provided in embodiments of the present disclosure can pass a test standard of 144 hours of perspiration resistance.

According to a fourth aspect, at least one embodiment of the present disclosure provides terminal equipment including a middle frame and any display module of the first aspect. The middle frame includes a frame and a front case. The inner surface of the display module body is fixedly connected to the front case.

In one embodiment, no waterproof glue is provided between the display module body and the frame.

Figure 13:
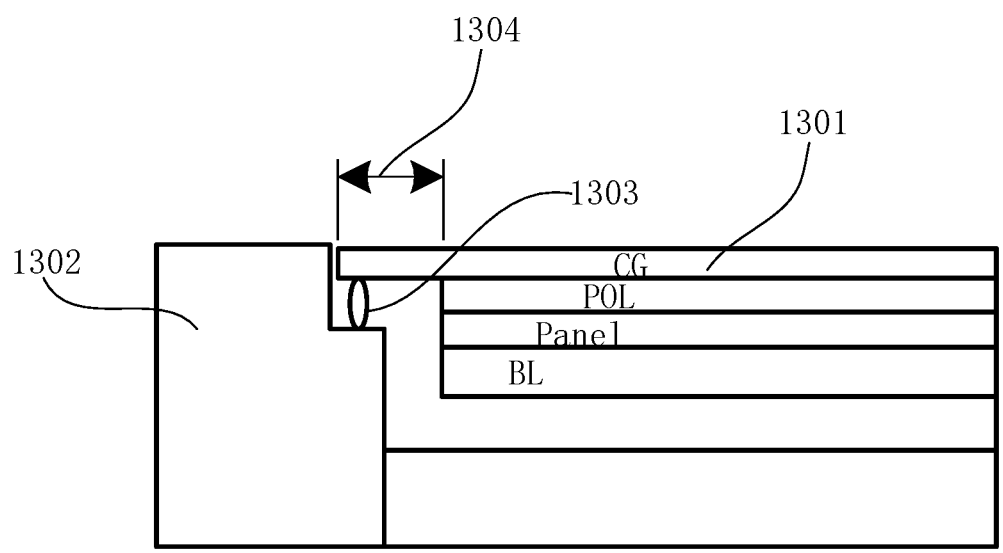
FIG. 13 is a schematic diagram of connection of a display module to terminal equipment in related art.

Referring to FIG. 13, in related art, when the display module is connected to the middle frame, a sealing connection between the cover glass 1301 and the frame 1302 of the middle frame is required (that is, the frame 1302 is bonded to the cover glass 1301 using the waterproof glue 1303 to furnish both the connection and waterproof treatment at the same time). Accordingly, the width for bonding may have to be reserved on the cover glass 1301. On the edge of the cover glass 1301, there is a black edge region 1304 that protrudes from the remaining layers of the display module. The width for bonding increases the width of the black edge region 1304, impacting the display effect of the display module, visually increasing the width of the frame.

Figure 14:
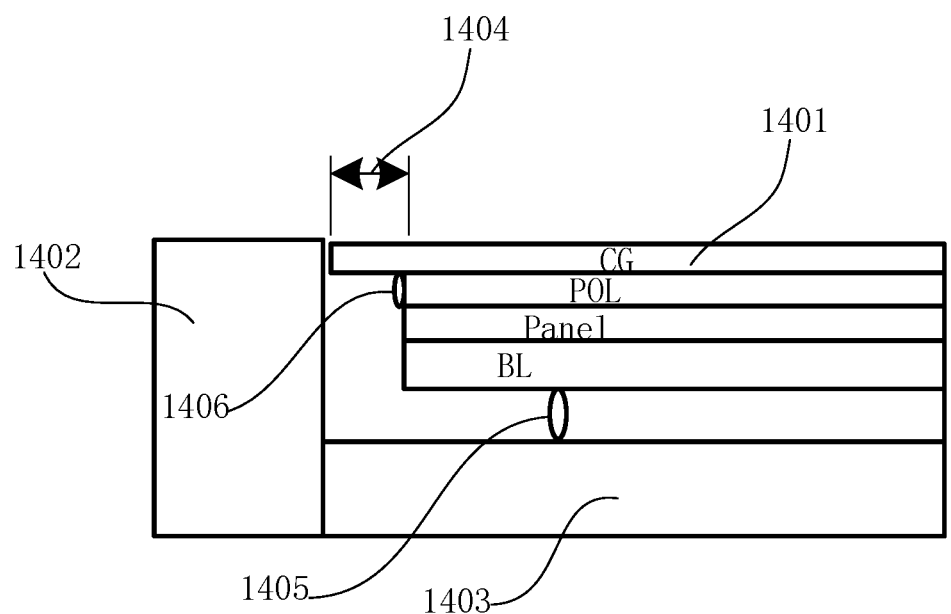
FIG. 14 is a schematic diagram of connection of a display module to terminal equipment according to an illustrative embodiment of the present disclosure.

Referring to FIG. 14, in the embodiment, the inner surface of the display module body is fixedly connected to the front case 1403 of the middle frame directly, such as using a glue 1405, implementing the connection between the display module and the middle frame. Moreover, since waterproof sealing treatment has been performed on the display module per se, no sealing is required between the frame 1402 and the cover glass 1401 (that is, it is not necessary to provide a waterproof glue between the frame 1402 and the cover glass 1401). Accordingly, no width for bonding has to be reserved on the cover glass 1301, reducing the black edge region 1404, improving the display effect, visually reducing the width of the frame, implementing the technical effect of a narrow frame.

In some examples, all side walls of the display module body are provided with the waterproof coating 1406, so that no waterproof sealing treatment is required between each side wall of the display module and the frame 1402 of the middle frame. Accordingly, the width of the black edge region 1404 of the display module is reduced in each direction. In other embodiments, some side walls of the display module body may be provided with the waterproof coating 1406. No waterproof sealing treatment is required between a side wall provided with the waterproof coating 1406 and the corresponding frame 1402, so that the width of the black edge region 1404 of the display module in the corresponding direction is reduced. Waterproof sealing treatment is required between a side wall provided with no waterproof coating 1406 and the corresponding frame 1402. That is, a sealing bond is required between the cover glass 1401 and the frame 1402, while both ends of a side wall provided with no waterproof coating 1406 may have to be sealed. That is, a sealing bond is required between the cover glass 1401 and the front case 1403, i.e., to cut off the communication between the side wall provided with no waterproof coating 1406 and the side wall provided with the waterproof coating 1406, so as to prevent moisture (entering from the gap between the side wall provided with the waterproof coating 1406 and the corresponding frame 1402) from affecting the side wall provided with no waterproof coating 1406.

Further note that herein by "multiple", it may mean two or more. Other quantifiers may have similar meanings. A term "and/or" may describe an association between associated objects, indicating three possible relationships. For example, by A and/or B, it may mean that there may be three cases, namely, existence of but A, existence of both A and B, or existence of but B. A slash mark "/" may generally denote an "or" relationship between two associated objects that come respectively before and after the slash mark. Singulars "a/an", "said" and "the" are intended to include the plural form, unless expressly illustrated otherwise by context.

Further note that although in drawings herein operations are described in a specific or der, it should not be construed as that the operations have to be performed in the specific or der or sequence, or that any operation shown has to be performed in or der to acquire an expected result. Under a specific circumstance, multitask and parallel processing may be advantageous.

Other implementations of the present disclosure will be apparent to a person having ordinary skill in the art that has considered the specification and practiced the present disclosure. The present disclosure is intended to cover any variation, use, or adaptation of the present disclosure following the general principles of the present disclosure and including such departures from the present disclosure as come within common knowledge or customary practice in the art. The specification and the embodiments are intended to be illustrative only, with a true scope and spirit of the present disclosure being indicated by the appended claims.

It should be understood that the present disclosure is not limited to the exact construction that has been described above and illustrated in the accompanying drawings, and that various modifications and changes can be made to the present disclosure without departing from the scope of the present disclosure. It is intended that the scope of the present disclosure is limited only by the appended claims.

According to a first aspect of embodiments of the present disclosure, there is provided a display module, including a display module body. At least one side wall of the display module body is provided with a waterproof coating.

In an embodiment, the display module body includes a polarizing layer. The waterproof coating may cover at least a side wall of the polarizing layer.

In an embodiment, the waterproof coating covers at least two side walls in a widthwise direction and one side wall in a lengthwise direction of the polarizing layer.

In an embodiment, a thickness of the waterproof coating is less than 0.05 mm.

In an embodiment, the waterproof coating includes:
a cross-linked polymer glue based on Silane-terminated polyether.

In an embodiment, the display module body further includes a bottom layer, a panel, and a cover glass.

At least one edge of the cover glass may be an arc-shaped edge bent toward an inner surface. The polarizing layer may be fit and connected to the inner surface of the cover glass. The panel may be fit and connected to a surface of the polarizing layer facing away from the cover glass. The bottom layer may be fit and connected to a surface of the panel facing away from the polarizing layer.

In an embodiment, the panel includes a polyimide layer, an organic light-emitting device layer, a thin film encapsulation layer, and a touch layer fit and connected in sequence. The polyimide layer may be fit and connected to the bottom layer. The touch layer may be fit and connected to the polarizing layer.

In an embodiment, the bottom layer includes a multi-buffer layer and a bottom film fit and connected. The multi-buffer layer may be fit and connected to the panel.

In an embodiment, the multi-buffer layer is made of polyethylene terephthalate.

According to a second aspect of embodiments of the present disclosure, there is provided a jig for making a display module of the first aspect, including a jig cover and a jig body rotatably connected to each other. The jig body is provided with a jig groove for placing the display module body. The jig cover is provided with a jig hole matching the jig groove.

According to a third aspect of embodiments of the present disclosure, there is provided a method for making a display module of the first aspect. The method includes:

making the display module body; and making the waterproof coating on the at least one side wall of the display module body.

In an embodiment, the display module body includes a polarizing layer.

The waterproof coating may cover at least one side wall of the polarizing layer.

In an embodiment, making the waterproof coating on the at least one side wall of the display module body includes:

placing the display module body in the jig of the first aspect, such that the at least one side wall of the polarizing layer is in an exposed state;

uniformly covering the at least one side wall of the polarizing layer with a waterproof glue through a glue spray process or a coating process; and curing the waterproof glue, forming the waterproof coating.

In an embodiment, at least one edge of the display module body is an arc-shaped edge bent toward an inner surface.

Placing the display module body in the jig, such that the at least one side wall of the polarizing layer is in the exposed state, may include:

placing the display module body in the jig groove, such that an outer surface of the display module body is connected to a bottom of the jig groove; and closing the jig groove using the jig cover, such that each side wall of the display module body is masked completely or partially, and the at least one side wall of the polarizing layer is in the exposed state.

In an embodiment, the method further includes: before uniformly covering the at least one side wall of the polarizing layer with the waterproof glue through the glue spray process or the coating process, providing a protective film on the inner surface of the display module body.

In an embodiment, making the waterproof coating on the at least one side wall of the polarizing layer includes:

making the waterproof coating on two side walls in a widthwise direction and one side wall in a lengthwise direction of the polarizing layer.

According to a fourth aspect of embodiments of the present disclosure, there is provided terminal equipment, including a middle frame and a display module of the first aspect.

The middle frame may include a frame and a front case connected to the frame. The inner surface of the display module body may be fixedly connected to the front case.

In an embodiment, no waterproof glue is provided between the display module body and the frame.

What is claimed is:

1. A display, comprising:
a display body, wherein a waterproof coating is disposed on at least one side wall of the display body, wherein the display body comprises a polarizing layer, and the waterproof coating covers at least one side wall of the polarizing layer,
wherein the display body further comprises a bottom layer, a panel, and a cover glass,
wherein at least one edge of the cover glass is an arc-shaped edge bent toward an inner surface, the polarizing layer is fit and connected to the inner surface of the cover glass, the panel is fit and connected to a surface of the polarizing layer facing away from the cover glass, and the bottom layer is fit and connected to a surface of the panel facing away from the polarizing layer.

2. The display of claim 1, wherein the waterproof coating covers at least two side walls in a widthwise direction and one side wall in a lengthwise direction of the polarizing layer.

3. The display of claim 1, wherein a thickness of the waterproof coating is less than 0.05 mm.

4. The display of claim 1, wherein the waterproof coating comprises:
a cross-linked polymer glue based on Silane-terminated polyether.

5. The display of claim 1, wherein the panel comprises a polyimide layer, an organic light-emitting device layer, a thin film encapsulation layer, and a touch layer fit and connected in sequence, wherein the polyimide layer is fit and connected to the bottom layer, and wherein the touch layer is fit and connected to the polarizing layer.

6. The display of claim 1, wherein the bottom layer comprises a multi-buffer layer and a bottom film fit and connected, and wherein the multi-buffer layer is fit and connected to the panel.

7. The display of claim 6, wherein the multi-buffer layer is made of polyethylene terephthalate.

8. The display of claim 1, wherein the display body is placed in a jig groove on a jig body, a jig comprises the jig body and a jig cover rotatably connected to each other, and the jig cover comprises a jig hole matching the jig groove.

9. A method for making a display, comprising:
making a display body, wherein the display comprises the display body, and a waterproof coating is disposed on at least one side wall of the display body;
making the waterproof coating on the at least one side wall of the display body, and
making the waterproof coating on at least one side wall of a polarizing layer, wherein the display body comprises the polarizing layer,
wherein the display body further comprises a bottom layer, a panel, and a cover glass,
wherein at least one edge of the cover glass is an arc-shaped edge bent toward an inner surface, the polarizing layer is fit and connected to the inner surface of the cover glass, the panel is fit and connected to a surface of the polarizing layer facing away from the cover glass, and the bottom layer is fit and connected to a surface of the panel facing away from the polarizing layer.

10. The method of claim 9, wherein making the waterproof coating on the at least one side wall of the display body comprises:
placing the display body in a jig, such that the at least one side wall of the polarizing layer is in an exposed state;
uniformly covering the at least one side wall of the polarizing layer with a waterproof glue through a glue spray process or a coating process; and
curing the waterproof glue to form the waterproof coating,
wherein the jig comprises a jig cover and a jig body rotatably connected to each other, wherein the jig body comprises a jig groove for placing the display body, and wherein the jig cover comprises a jig hole matching the jig groove.

11. The method of claim 10, wherein at least one edge of the display body is an arc-shaped edge bent toward an inner surface, wherein placing the display body in the jig, such that the at least one side wall of the polarizing layer is in the exposed state comprises:

placing the display body in the jig groove, such that an outer surface of the display body is connected to a bottom of the jig groove; and closing the jig groove using the jig cover, such that each side wall of the display body is masked completely or partially, and the at least one side wall of the polarizing layer is in the exposed state.

12. The method of claim 11, further comprising:

disposing a protective film on the inner surface of the display body.

13. The method of claim 9, wherein the making the waterproof coating on the at least one side wall of the polarizing layer comprises:

making the waterproof coating on two side walls in a widthwise direction and one side wall in a lengthwise direction of the polarizing layer.

14. A terminal equipment, comprising:

a middle frame and a display, wherein the display comprises a display body, and a waterproof coating is disposed on at least one side wall of the display body; and wherein the middle frame comprises a frame and a front case connected to the frame, and an inner surface of the display body is fixedly connected to the front case, wherein the display body comprises a polarizing layer, and the waterproof coating covers at least one side wall of the polarizing layer, wherein the display body further comprises a bottom layer, a panel, and a cover glass, wherein at least one edge of the cover glass is an arc-shaped edge bent toward an inner surface, the polarizing layer is fit and connected to the inner surface of the cover glass, the panel is fit and connected to a surface of the polarizing layer facing away from the cover glass, and the bottom layer is fit and connected to a surface of the panel facing away from the polarizing layer.

15. The terminal equipment of claim 14, wherein no waterproof glue is placed between the display body and the frame.

* * * * *